(12) United States Patent
Hayashi et al.

(10) Patent No.: US 11,022,870 B2
(45) Date of Patent: Jun. 1, 2021

(54) FLUORESCENT LIGHT SOURCE DEVICE

(71) Applicant: Ushio Denki Kabushiki Kaisha, Tokyo (JP)

(72) Inventors: Kenji Hayashi, Tokyo (JP); Kiyoyuki Kabuki, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/764,834

(22) PCT Filed: Sep. 4, 2018

(86) PCT No.: PCT/JP2018/032697
§ 371 (c)(1),
(2) Date: May 15, 2020

(87) PCT Pub. No.: WO2019/097817
PCT Pub. Date: May 23, 2019

(65) Prior Publication Data
US 2020/0341359 A1 Oct. 29, 2020

(30) Foreign Application Priority Data
Nov. 17, 2017 (JP) .............................. JP2017-221749

(51) Int. Cl.
*G03B 21/20* (2006.01)
*G02B 27/14* (2006.01)

(52) U.S. Cl.
CPC ......... *G03B 21/204* (2013.01); *G02B 27/141* (2013.01); *G03B 21/2013* (2013.01); *G03B 21/2066* (2013.01); *G03B 21/2073* (2013.01)

(58) Field of Classification Search
CPC .............. G03B 21/204; G03B 21/2013; G03B 21/2066; G03B 21/2073; G02B 27/141
See application file for complete search history.

(56) References Cited

U.S. PATENT DOCUMENTS

2012/0268917 A1* 10/2012 Kitano ............... G03B 21/2073
362/84
2013/0083294 A1* 4/2013 Tseng ................... G03B 21/204
353/31
(Continued)

FOREIGN PATENT DOCUMENTS

JP 2014-507055 A 3/2014
JP 2014-110109 A 6/2014
(Continued)

OTHER PUBLICATIONS

International Search Report issued in PCT/JP2018/032697; dated Nov. 20, 2018.
(Continued)

*Primary Examiner* — Evan P Dzierzynski
(74) *Attorney, Agent, or Firm* — Studebaker & Brackett PC

(57) ABSTRACT

The fluorescent light source device according to this invention includes: a light-emitting device emitting blue excitation light; a wavelength conversion device excited by the excitation light and producing yellow fluorescence; and a first dichroic mirror including a region that reflects or transmits the excitation light and a region that transmits or reflects the fluorescence and partial excitation light that was not converted by the wavelength conversion device. The fluorescent light source device mixes fluorescence and partial excitation light from the wavelength conversion device together and emits white light, and further includes an auxiliary light source emitting light in a blue region identical to that of the excitation light. Radiation light from the auxiliary light source is mixed with white light that is a mixture of the fluorescence and the partial excitation light from the first dichroic mirror.

7 Claims, 10 Drawing Sheets

(56) References Cited

U.S. PATENT DOCUMENTS

| | | |
|---|---|---|
| 2013/0215397 A1 | 8/2013 | Matsubara |
| 2013/0329448 A1 | 12/2013 | Franz et al. |
| 2014/0254129 A1 | 9/2014 | Miyoshi et al. |
| 2015/0167932 A1 | 6/2015 | Yamada et al. |
| 2015/0205189 A1 | 7/2015 | Nojima |
| 2018/0073716 A1 | 3/2018 | Takada et al. |
| 2019/0079376 A1* | 3/2019 | Itoh .................. G03B 21/16 |

FOREIGN PATENT DOCUMENTS

| | | |
|---|---|---|
| JP | 2014-174264 A | 9/2014 |
| JP | 2015-138168 A | 7/2015 |
| JP | 2016-189440 A | 11/2016 |
| JP | 2017-188328 A | 10/2017 |
| WO | 2012/063322 A1 | 5/2012 |
| WO | 2014/038434 A1 | 3/2014 |

OTHER PUBLICATIONS

Written Opinion issued in PCT/JP2018/032697; dated Nov. 20, 2018.

* cited by examiner

FLUORESCENT LIGHT SOURCE DEVICE

TECHNICAL FIELD

The present invention relates to a light source device used for a projector or the like, and more particularly to a fluorescent light source device that uses a wavelength conversion device that converts excitation light from a light-emitting device into fluorescence.

BACKGROUND ART

Fluorescent light source devices including an excitation light source that is a solid light-emitting device such as a laser diode and a wavelength conversion device receiving the excitation light from the excitation light source and producing fluorescence have been proposed as the light source device mounted to a projector device.

For example, JP-A-2016-189440 (Patent Document 1) discloses a fluorescent light source device including a light-emitting device that emits excitation light, and a wavelength conversion device that converts the excitation light from this light-emitting device into fluorescence.

In such a fluorescent light source device, the excitation light is partially converted into fluorescence, and part of the excitation light that was not converted into fluorescence is output from the wavelength conversion device.

Assuming that excitation light is blue and fluorescence is yellow, the excitation light output from the wavelength conversion device, which is blue, and the fluorescence, which is yellow, can be emitted as white light when mixed together.

FIG. 10 illustrates a schematic configuration of the fluorescent light source device 100 that has been disclosed, the device including light-emitting devices 101 that are laser diodes and the like and emit excitation light, a wavelength conversion device 102 irradiated with the excitation light A from the light-emitting devices 101 and producing fluorescence B of a different wavelength from that of the excitation light, a dichroic mirror 103 reflecting and folding the excitation light toward the wavelength conversion device 102, and a focusing lens 104 focusing the excitation light onto the wavelength conversion device 102. Reflection parts 105 are provided to parts of the dichroic mirror 103 to reflect the excitation light A from the light-emitting devices 101 to cause the light to enter the focusing lens 104.

A reflection layer 106 that reflects the excitation light A and fluorescence B is provided on the backside of the wavelength conversion device 102.

In such a fluorescent light source device 100, the light-emitting devices 101 emit blue excitation light A, and the wavelength conversion device 102 converts this excitation light into yellow fluorescence B. Part of the blue excitation light (A1) that was not used in the conversion into the fluorescence is taken out and mixed with the fluorescence B so that white light can be obtained. Namely, the wavelength conversion device 102 converts part of the excitation light A into fluorescence B, while outputting part of the remaining excitation light (A1) as it is. The dichroic mirror 103 is designed to transmit the fluorescence B from the wavelength conversion device 102 and the partial excitation light A1 that was not used in the conversion, so that these are then mixed to obtain white light.

By providing the reflection layer 106 on the backside of the wavelength conversion device 102 in the fluorescent light source device 100 in such a mode of use, the fluorescence and excitation light from the wavelength conversion device 102 toward the backside can be reflected and output from the front side in an efficient manner.

The color temperature of the white light eventually emitted from such a fluorescent light source device is determined by the balance between the blue light (excitation light) and yellow light (fluorescence) that make up the output white light. When the blue light is too intense, the white light takes on a blue tint, and when the yellow light is too intense, the white light takes on a yellow tint.

Such a fluorescent light source device is required of maintaining a constant color tint of the output white light even when the intensity of excitation light fluctuates. For applications as light sources of projectors, for example, this requirement is stricter.

A typical example in which the intensity of excitation light fluctuates is when the light source is switched between an illumination mode at rated conditions and an economical mode (in which the intensity of the emitted light is lowered for energy saving). Another example is when the intensity of the excitation light declines due to the deterioration of the light-emitting device itself.

Existing fluorescent light source devices are not capable of maintaining a constant color tint of emitted light when the intensity of the excitation light fluctuates.

One reason may be that the proportion of the excitation light converted by the wavelength conversion device into fluorescence (conversion efficiency) cannot be made constant in accordance with the fluctuations in the intensity of excitation light.

The conversion efficiency into fluorescence of the wavelength conversion device depends on the temperature. The higher the temperature, the lower the conversion efficiency tends to be. Therefore, a decline in the intensity of excitation light reduces the temperature of the wavelength conversion device, which causes a change in the conversion efficiency, more specifically raises the conversion efficiency, as a result of which the proportion of the fluorescent component is increased and the emitted white light takes on a yellow tint.

Namely, in the case with illumination in an economical mode, if the light source is designed to emit light in a predetermined proportion between excitation light and fluorescence set such as to provide desired white light when illuminated at rated conditions, the input to the wavelength conversion device will be lowered when illuminated in the economical mode. Thereupon the temperature of the wavelength conversion device is reduced and the conversion efficiency is changed (increased), leading to an increase in the fluorescent component (yellow light) and resulting in the white light taking on a yellow tint.

PRIOR ART DOCUMENT

Patent Document

Patent Document 1: JP-A-2016-189440

SUMMARY OF THE INVENTION

Problems to be Solved by the Invention

The problem to be solved by the invention is to provide a fluorescent light source device, which includes a light-emitting device emitting excitation light, a wavelength conversion device excited by the excitation light and producing fluorescence, a focusing optical system focusing the excitation light onto the wavelength conversion device, and a dichroic mirror that reflects or transmits the excitation light and transmits or reflects the fluorescence, and which mixes the fluorescence from the wavelength conversion device and partial excitation light that was not converted by the wavelength conversion device together and emits white light, the fluorescent light source device being capable of maintaining a constant color temperature of the emitted white light even when the intensity of the excitation light fluctuates.

Means for Solving the Problems

To solve the problem, the fluorescent light source device according to this invention includes: a light-emitting device emitting blue excitation light; a wavelength conversion device excited by the excitation light and producing yellow fluorescence; a focusing optical system focusing the excitation light onto the wavelength conversion device; and a first dichroic mirror including a region that reflects or transmits the excitation light and a region that transmits or reflects the fluorescence and partial excitation light that was not converted by the wavelength conversion device.

The fluorescent light source device mixes fluorescence and partial excitation light from the wavelength conversion device together and emits white light, and further includes an auxiliary light source emitting light in a blue region identical to that of the excitation light. Radiation light from the auxiliary light source is mixed with white light that is a mixture of the fluorescence and the partial excitation light from the first dichroic mirror.

In the fluorescent light source device, the wavelength conversion device includes a reflection layer provided on an opposite side from a light incident surface of the wavelength conversion device and reflecting the fluorescence and the partial excitation light.

In the fluorescent light source device, the first dichroic mirror reflects the excitation light and transmits the fluorescence and partial excitation light that was not converted by the wavelength conversion device. The auxiliary light source emits light in a blue region identical to that of the excitation light from the light-emitting device and of a different wavelength. The fluorescent light source device further includes a second dichroic mirror that is wavelength-selective and transmits fluorescence and partial excitation light that have been transmitted through the first dichroic mirror while reflecting radiation light from the auxiliary light source, between the auxiliary light source and the first dichroic mirror.

In the fluorescent light source device, the first dichroic mirror is provided, on a surface thereof from which the fluorescence and the partial excitation light exit, with a function of transmitting the fluorescence and the partial excitation light and of reflecting radiation light from the auxiliary light source, to serve as both the first dichroic mirror and the second dichroic mirror.

In the fluorescent light source device, the first dichroic mirror reflects the excitation light and transmits the fluorescence and partial excitation light that was not converted by the wavelength conversion device. The auxiliary light source emits light of a wavelength identical to that of the excitation light from the light-emitting device. The fluorescent light source device further includes a second dichroic mirror that is polarization-selective and transmits the fluorescence that has been transmitted through the first dichroic mirror, and transmits and reflects a P-polarized component and an S-polarized component, respectively, of the partial excitation light and radiation light from the auxiliary light source, between the auxiliary light source and the first dichroic mirror.

In the fluorescent light source device, the first dichroic mirror is provided, on a surface thereof from which the fluorescence and the partial excitation light exit, with a function of transmitting the fluorescence, and of transmitting and reflecting a P-polarized component and an S-polarized component, respectively, of the partial excitation light and radiation light from the auxiliary light source, to serve as both the first dichroic mirror and the second dichroic mirror.

The fluorescent light source device further includes a polarization conversion device that converts a P-polarized component of radiation light from the auxiliary light source into an S-polarized component, between the auxiliary light source and the second dichroic mirror.

In the fluorescent light source device, the first dichroic mirror transmits the excitation light and reflects the fluorescence and partial excitation light that was not converted by the wavelength conversion device. The auxiliary light source emits light in a blue region identical to that of the excitation light from the light-emitting device and of a different wavelength. The auxiliary light source is disposed opposite the first dichroic mirror so that radiation light from the auxiliary light source is transmitted therethrough, and that the radiation light is mixed with white light that is a mixture of the fluorescence and the partial excitation light reflected by the first dichroic mirror.

In the fluorescent light source device, the first dichroic mirror transmits the excitation light and reflects the fluorescence and partial excitation light that was not converted by the wavelength conversion device. The auxiliary light source emits light in a blue region identical to that of the excitation light from the light-emitting device and of a different wavelength. The fluorescent light source device further includes a second dichroic mirror that is wavelength-selective and transmits fluorescence and partial excitation light reflected by the first dichroic mirror while reflecting radiation light from the auxiliary light source, in an optical path of the fluorescence and the partial excitation light reflected by the first dichroic mirror.

In the fluorescent light source device, the first dichroic mirror transmits the excitation light and reflects the fluorescence and partial excitation light that was not converted by the wavelength conversion device.

The auxiliary light source emits light of a wavelength identical to that of the excitation light from the light-emitting device.

The fluorescent light source device further includes a second dichroic mirror that is polarization-selective and transmits fluorescence reflected by the first dichroic mirror, and transmits and reflects a P-polarized component and an S-polarized component, respectively, of the partial excitation light and radiation light from the auxiliary light source, in an optical path of the fluorescence and the partial excitation light reflected by the first dichroic mirror.

The fluorescent light source device further includes a polarization conversion device that converts a P-polarized component of radiation light from the auxiliary light source into an S-polarized component, between the auxiliary light source and the second dichroic mirror.

Effect of the Invention

The fluorescent light source device of this invention allows an adequate proportion of a fluorescent component and an excitation light component of the light emitted from the fluorescent light source device to be maintained so that the color temperature of the emitted white light can always be kept constant, by emitting light in the same blue region as the excitation light from an auxiliary light source and mixing the light with the fluorescence and part of the excitation light that have been transmitted through a dichroic mirror in an event of a relative increase of the fluorescent component (yellow light) as a result of a fluctuation (decline) in the intensity of the excitation light from the light-emitting device.

MODE FOR CARRYING OUT THE INVENTION

Figure 1:
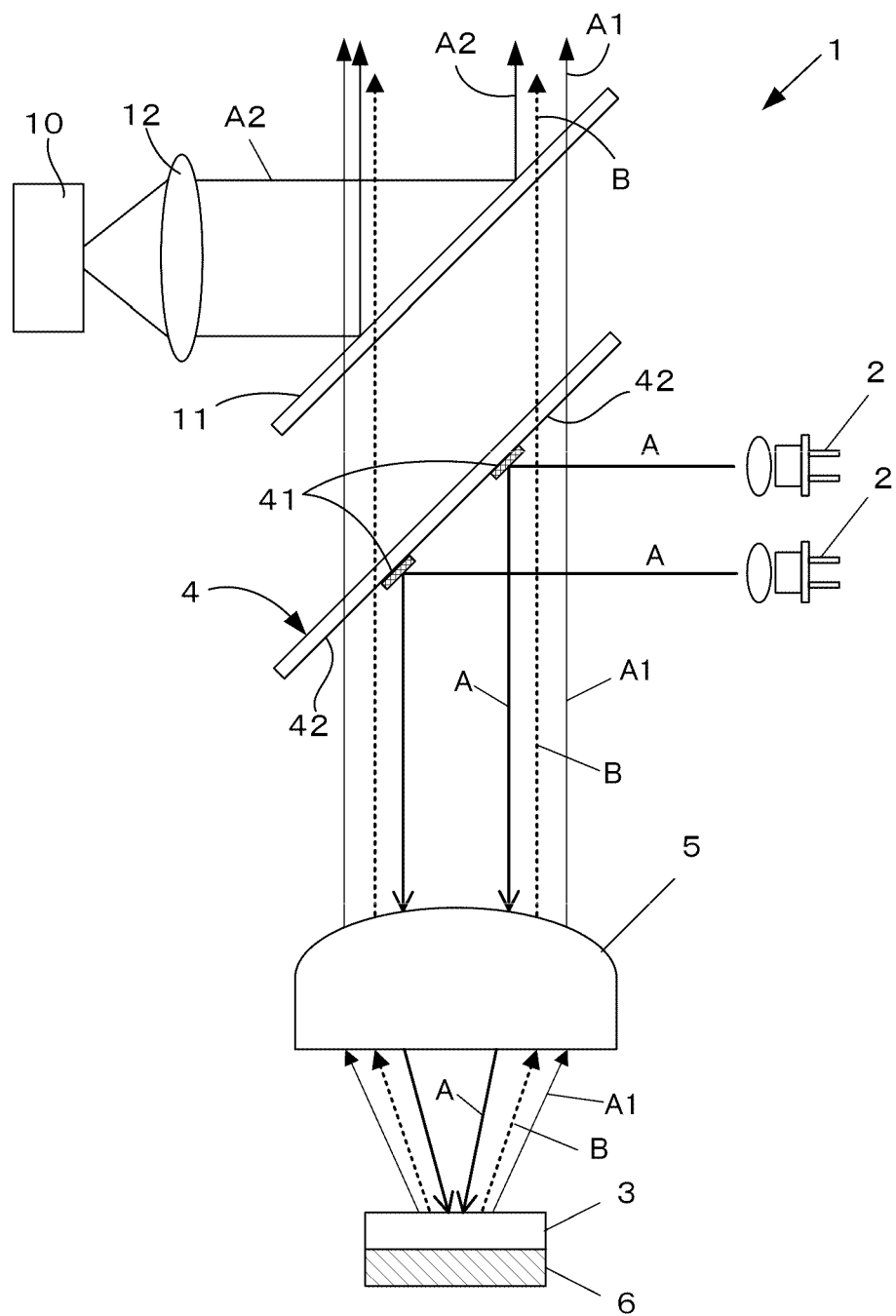
FIG. 1 is a schematic diagram illustrating a first embodiment of the fluorescent light source device of the present invention.

As illustrated in FIG. 1, the fluorescent light source device 1 of the present invention includes light-emitting devices 2 that emit blue excitation light A, a wavelength conversion device 3 irradiated with the excitation light A from the light-emitting devices 2 and producing yellow fluorescence B, and a focusing optical system 5 disposed on an optical path between the light-emitting devices 2 and the wavelength conversion device 3.

This wavelength conversion device 3 converts part of the blue excitation light A from the light-emitting devices 2 into yellow fluorescence B, while outputting the rest of the excitation light that was not used in the conversion into fluorescent light (hereinafter referred to as partial excitation light A1) as it is. The partial excitation light A1 output from this wavelength conversion device 3 is part of the excitation light A that entered the wavelength conversion device 3 and was diffused by grains and grain boundaries contained in the wavelength conversion device 3. Therefore, the partial excitation light A1 output from the wavelength conversion device 3 has a low coherence, so that it is unlikely to generate speckles that cause degradation of the screen quality.

A reflection layer 6 is formed on the backside of the wavelength conversion device 3 for enabling efficient output of fluorescence B and partial excitation light A1 from the wavelength conversion device 3 toward the focusing optical system 5.

The light-emitting device 2 is a semiconductor laser (LD) and emits blue light (e.g., with a center wavelength of 440 to 470 nm). In this embodiment, an LD that emits light having a center wavelength of 455 nm is used.

The wavelength conversion device 3 includes a phosphor, and may be in the form of a plate-like polycrystalline formed by mixing a phosphor that is a YAG crystalline material with aluminum oxide or the like, or a phosphor in powder form mixed in a silicone binder or the like and applied on a substrate. The wavelength conversion device 3 converts the excitation light from the light-emitting device 2 into yellow fluorescence (light of a broad visible spectrum ranging from 470 to 800 nm with a peak wavelength of, e.g., 525 to 575 nm).

A first dichroic mirror 4 is disposed between the light-emitting devices 2 and the focusing optical system 5.

This first dichroic mirror 4 is provided with an excitation light reflecting part 41 that reflects the blue excitation light A from the light-emitting devices 2, and a fluorescence/excitation light transmitting part 42 that transmits the yellow fluorescence B and the blue partial excitation light A1 from the wavelength conversion device 3. The excitation light reflecting part 41 may be transmissive to fluorescence.

The excitation light reflecting part 41 of the first dichroic mirror 4 may be provided by forming a dielectric multilayer film on a part of a light-transmitting base member such as a glass material. The excitation light reflecting part 41 is formed at a point irradiated with the excitation light A from the light-emitting devices 2. For example, the excitation light reflecting part may be designed to have a cut-off wavelength of 475 nm, reflecting wavelengths of 475 nm or less while transmitting wavelengths of 475 nm or more.

The remaining parts where the excitation light reflecting part 41 made of the dielectric multilayer film is not formed are the fluorescence/excitation light transmitting part 42.

In the configuration above, the excitation light A from the light-emitting devices 2 is reflected by the excitation light reflecting part 41 of the first dichroic mirror 4 and travels toward the focusing optical system 5. The excitation light A is focused here and enters the wavelength conversion device 3. The fluorescence B converted by the wavelength conversion device 3, and the partial excitation light A1 that was not used in the conversion, travel from the wavelength conversion device 3 toward the focusing optical system 5, and from there toward the first dichroic mirror 4.

The fluorescence B and partial excitation light A1 pass through the fluorescence/excitation light transmitting part 42 of the first dichroic mirror 4 and exit from the fluorescent light source device 1 as white light.

In this invention, in addition to the configuration above, an auxiliary light source 10 that emits light in the same blue region as that of the excitation light A is provided. In this embodiment, the auxiliary light source 10 emits light in the same blue region as that of the excitation light A but of different wavelengths. For example, a blue LED that emits light having a center wavelength of around 430 nm is used.

A second dichroic mirror 11 is disposed in an optical path of the fluorescence B and partial excitation light A1 that have been transmitted through the first dichroic mirror 4. The auxiliary light source 10 is disposed opposite one side of this second dichroic mirror 11.

This second dichroic mirror 11 is formed by providing a dielectric multilayer film on a light-transmitting base member such as a glass material and has a cut-off wavelength of around 440 nm. Therefore, the fluorescence B (of wavelengths of 525 to 575 nm) and partial excitation light A1 (with a center wavelength of 455 nm) output from the wavelength conversion device 3 and transmitted through the first dichroic mirror 4 pass through this second dichroic mirror 11.

In the configuration above, in an event of a relative decline of the partial excitation light A1 that is a blue component in the white light emitted from the fluorescent light source device 1 and a relative increase of the yellow component or the fluorescence B as a result of fluctuations in the intensity of the excitation light A from the light-emitting devices 2, the auxiliary light source 10 is illuminated as illustrated in FIG. 1. Radiation light A2 (with a center wavelength of 430 nm) from this auxiliary light source 10 is collimated by a collimation lens 12 toward the second dichroic mirror 11, reflected there and mixed with the fluorescence B and partial excitation light A1.

Thus the radiation light A2 from the auxiliary light source 10 compensates for the blue component that has diminished relatively, causing a yellow tint in the white light as a whole, so that the white light can maintain an adequate color temperature.

In the case where a light source that emits natural light such as an LED is used as the auxiliary light source 10, screen quality degradation is less likely, as the LED emits low-coherence light and hardly causes generation of speckles when compensating for the blue component.

Figure 2:
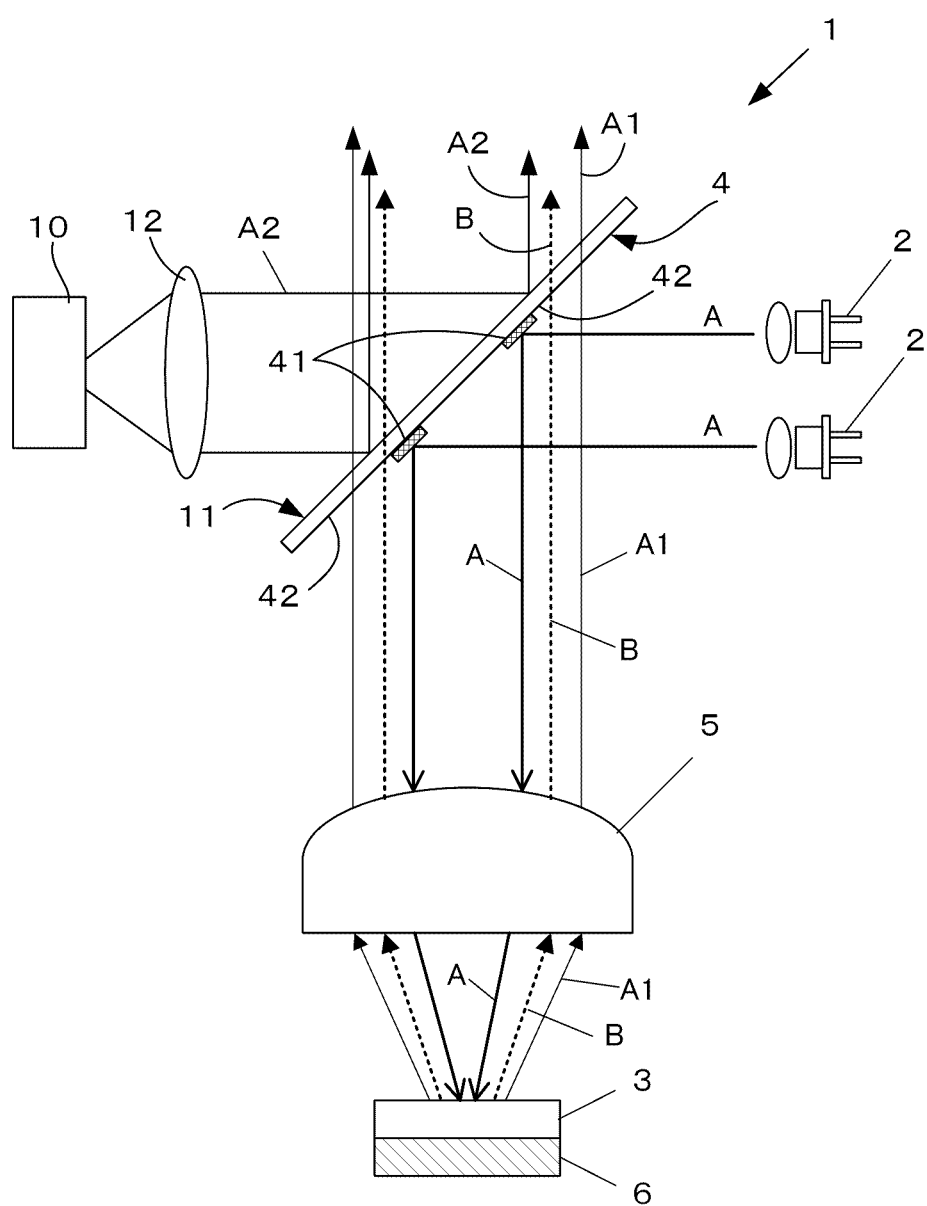
FIG. 2 is a schematic diagram of a second embodiment.

FIG. 2 illustrates a second embodiment. While the first dichroic mirror 4 and second dichroic mirror 11 are separate structures in the first embodiment of FIG. 1, the first dichroic mirror 4 of the second embodiment doubles as and serves the function of the second dichroic mirror 11.

Namely, the first dichroic mirror 4 is provided with a wavelength-selecting function on its backside, i.e., the exit surface from which the fluorescence B and partial excitation light A1 from the wavelength conversion device 3 exit. A dielectric multilayer film is formed on this exit surface to provide the function of transmitting the fluorescence B (of wavelengths of 525 to 575 nm) and partial excitation light A1 (with a center wavelength of 455 nm) while reflecting the radiation light A2 (with a center wavelength of 430 nm) from the auxiliary light source 10. In this case, too, the radiation light A2 from the auxiliary light source 10 is in the same blue region as the excitation light A from the light-emitting devices 2 and partial excitation light A1 but of different wavelengths.

The same effects as those of the first embodiment in FIG. 1 are provided, i.e., in an event of a relative increase in the fluorescence B component as a result of a relative decline in the partial excitation light A1 component due to fluctuations in intensity of the excitation light from the wavelength conversion device 3, the radiation light A2 that is blue light from the auxiliary light source 10 is mixed with the fluorescence and partial excitation light so that an adequate color temperature of the white light can be maintained.

In the first and second embodiments described above, the second dichroic mirror 11 is a wavelength-selective dichroic mirror that selectively reflects or transmits light depending on the wavelength. The embodiments illustrated in FIG. 3 to FIG. 5 use a polarization-selective dichroic mirror that utilizes polarization of light.

Namely, the second dichroic mirror 11 transmits and reflects the P-polarized component and S-polarized component, respectively, of the partial excitation light A1 transmitted through the first dichroic mirror 4 and the radiation light A2 from the auxiliary light source 10, this function being achieved by a dielectric multilayer film.

Figure 3:
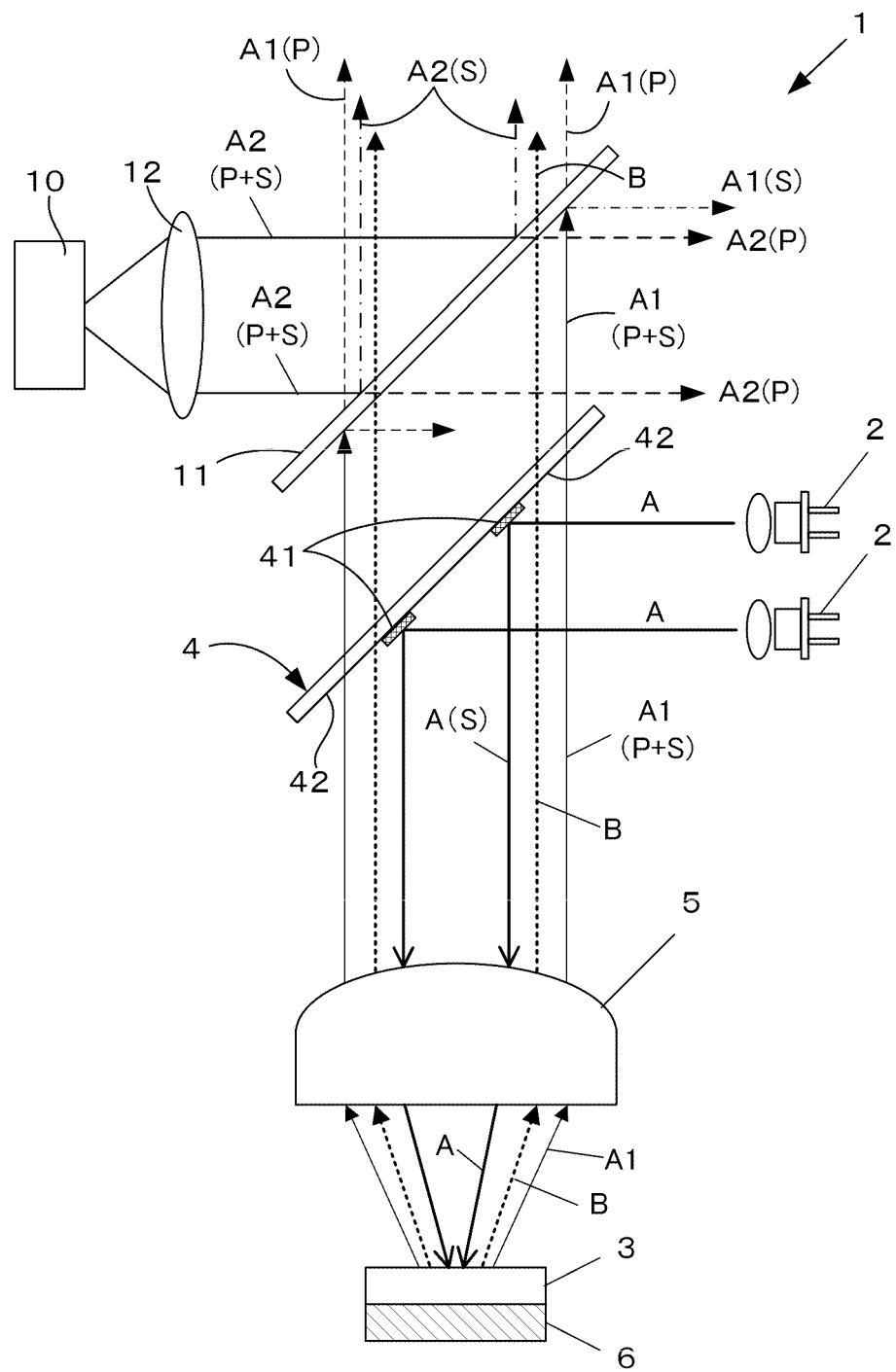
FIG. 3 is a schematic diagram of a third embodiment.

In the third embodiment illustrated in FIG. 3, the partial excitation light A1 transmitted through the first dichroic mirror 4 contains a P-polarized component and an S-polarized component, and the polarization-selective second dichroic mirror 11 reflects the S-polarized component (A1(S)) and transmits the P-polarized component (A1(P)) of this light.

The second dichroic mirror 11 reflects the S-polarized component (A2(S)) and transmits the P-polarized component (A2(P)) of the blue light A2 emitted from the auxiliary light source 10.

Thus the S-polarized component of the radiation light A2 from the auxiliary light source 10 is reflected by the second dichroic mirror 11 and mixed with the white light emitted from the fluorescent light source device 1.

In this third embodiment that utilizes polarization of light, an LED that emits light of the same wavelength as that of the excitation light A from the light-emitting devices 2 may be used as the auxiliary light source 10.

The radiation light A2 from the auxiliary light source 10 has the same blue wavelength as that of the excitation light A, and can more effectively compensate for the blue component in the white light emitted from the fluorescent light source device 1.

Figure 4:
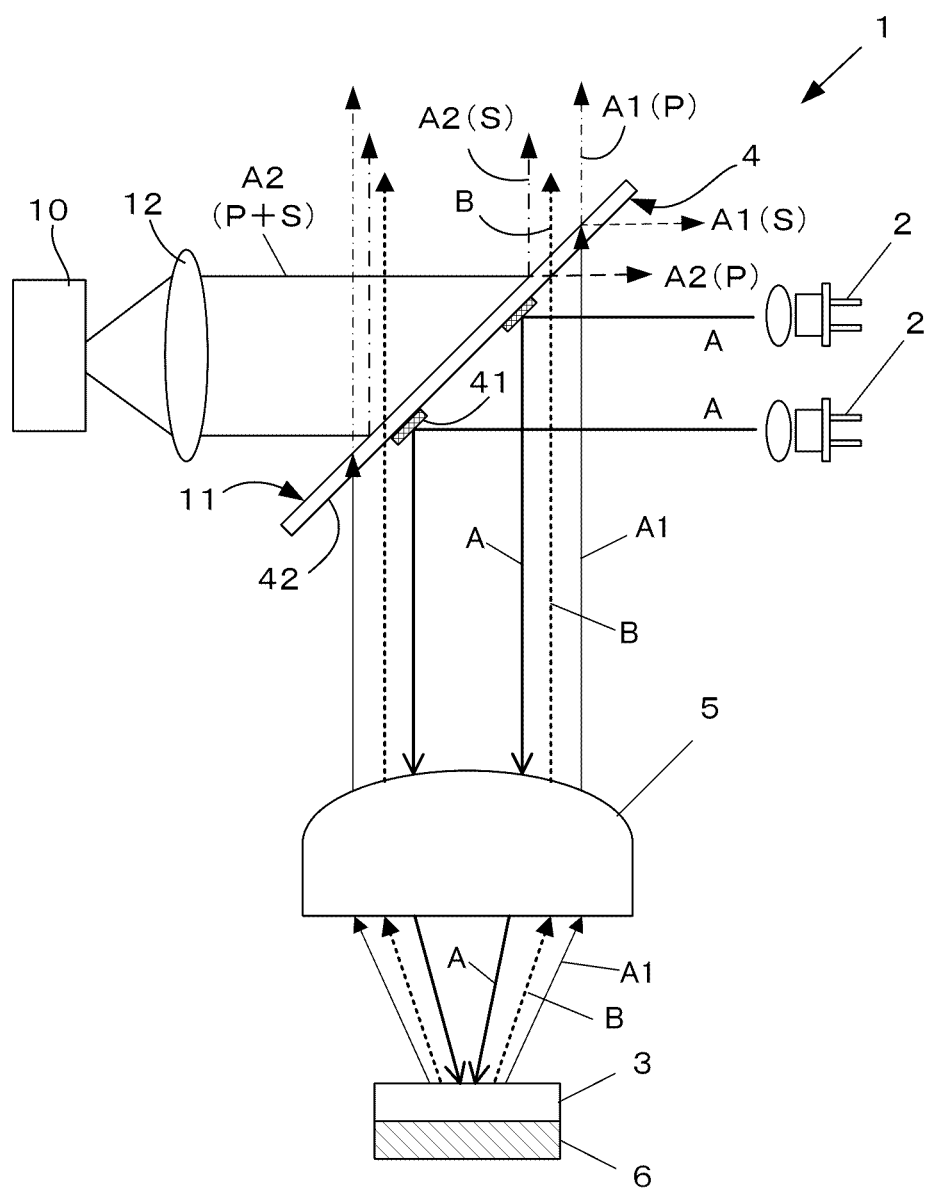
FIG. 4 is a schematic diagram of a fourth embodiment.

A fourth embodiment of FIG. 4 corresponds to the second embodiment of FIG. 2, i.e., the first dichroic mirror 4 doubles as and serves the function of the second dichroic mirror 11. Namely, the first dichroic mirror 4 is provided with a polarization-selecting function by forming a dielectric multilayer film on its backside, i.e., the exit surface from which the fluorescence B and partial excitation light A1 from the wavelength conversion device 3 exit.

This exit surface transmits and reflects the P-polarized component (A1(P)) and the S-polarized component (A1(S)), respectively, of the blue partial excitation light A1 from the wavelength conversion device 3, and reflects and transmits the S-polarized component (A2(S)) and the P-polarized component (A2(P)), respectively, of the blue radiation light A2 from the auxiliary light source 10.

Thus the radiation light A2 from the auxiliary light source 10 is mixed with the output light including the fluorescence B and partial excitation light A1 transmitted through the first dichroic mirror 4 that doubles as the second dichroic mirror 11.

Figure 5:
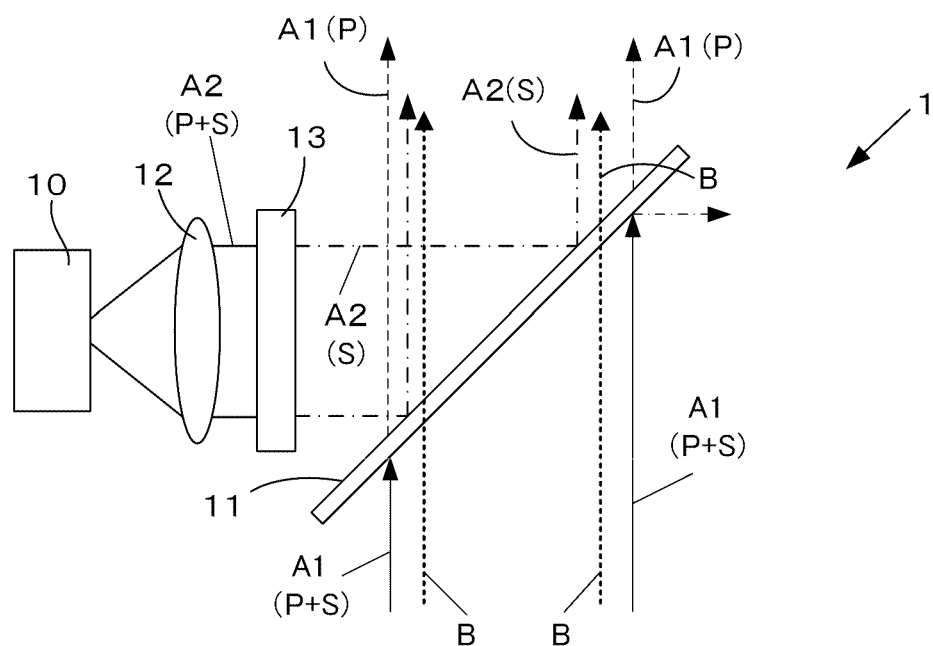
FIG. 5 is a schematic diagram of a fifth embodiment.

FIG. 5 illustrates a fifth embodiment in which a polarization conversion device 13 is disposed between the auxiliary light source 10 and the second dichroic mirror 11. This polarization conversion device 13 changes the P-polarized component of the radiation light A2 from the auxiliary light source 10 into the S-polarized component, so that the radiation light A2 from the auxiliary light source 10 is entirely the S-polarized component, which is all reflected by the second dichroic mirror 11 and mixed with the white light. Therefore, all the radiation light A2 from the auxiliary light source 10 can be efficiently utilized.

In each of the embodiments described above and illustrated in FIG. 1 to FIG. 5, the first dichroic mirror 4 reflects the excitation light A from the light-emitting devices 2 to cause the light to enter the wavelength conversion device 3, and the fluorescence B and partial excitation light A1 from the wavelength conversion device 3 pass through the first dichroic mirror 4 and exit the fluorescent light source device 1. The relationship between these components may be inverted.

Namely, the excitation light A may pass through the first dichroic mirror 4 and enter the wavelength conversion device 3, and the fluorescence B and partial excitation light A1 from the wavelength conversion device 3 may be reflected and emitted from the fluorescent light source device 1.

FIG. 6 to FIG. 9 illustrate embodiments in this form.

Figure 6:
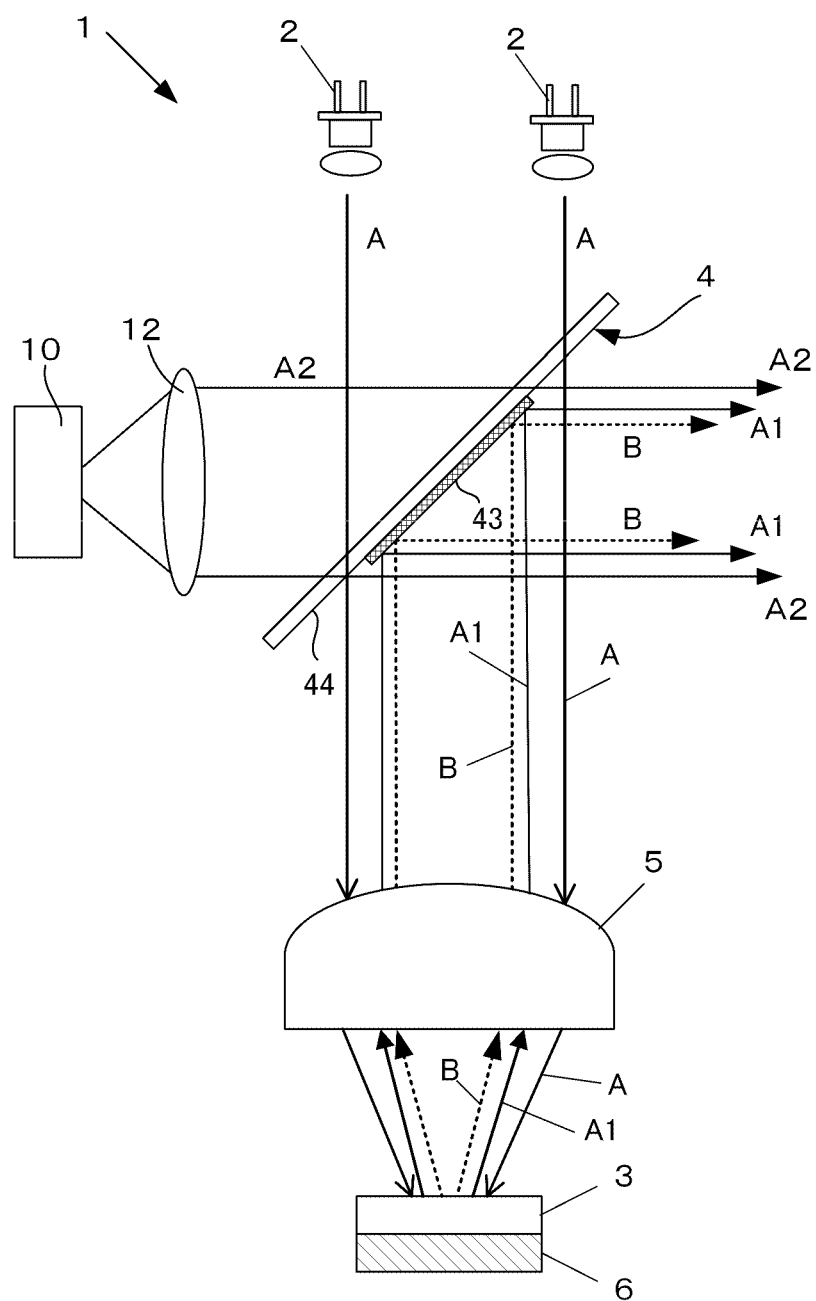
FIG. 6 is a schematic diagram of a sixth embodiment.

In a sixth embodiment illustrated in FIG. 6, fluorescence/excitation light reflecting part 43 is provided to the first dichroic mirror 4 by forming a dielectric multilayer film to a part thereof, the remaining part being an excitation light transmitting part 44.

The blue excitation light A from the light-emitting devices 2 passes through the excitation light transmitting part 44 of the first dichroic mirror 4 and enters the wavelength conversion device 3. The yellow fluorescence B and the blue partial excitation light A1 from the wavelength conversion device 3 are reflected by the fluorescence/excitation light reflecting part 43 of the first dichroic mirror 4 and emitted to the outside.

An auxiliary light source 10 is provided opposite one side of the first dichroic mirror 4. This auxiliary light source 10 emits light in the same blue region as that of the excitation light A but of different wavelengths.

The fluorescence/excitation light reflecting part 43 of the first dichroic mirror 4 is designed to reflect the excitation light A from the light-emitting devices 2 and transmit the illumination light A2 from the auxiliary light source 10. For example, when the excitation light A is blue light having a center wavelength of around 455 nm and the radiation light A2 from the auxiliary light source 10 is blue light having a center wavelength of around 430 nm, the cut-off wavelength is set at around 440 nm so that wavelengths of 440 nm or more are reflected and wavelengths of 440 nm or less are transmitted.

Thus, partial excitation light A1 (with a center wavelength of 455 nm) and fluorescence B (of wavelengths of 525 to 575 nm) from the wavelength conversion device 3 are reflected by the fluorescence/excitation light reflecting part 43 of the first dichroic mirror 4, while the radiation light A2 (with a center wavelength of 430 nm) from the auxiliary light source 10 is transmitted through the fluorescence/excitation light reflecting part 43.

This configuration allows the blue radiation light A2 from the auxiliary light source 10 to be added to the white light output from the wavelength conversion device 3 and emitted from the fluorescent light source device 1 to the outside.

This configuration has an advantage that the second dichroic mirror, which is used in the first to fifth embodiments described above or the seventh to ninth embodiments to be described later, is not necessary.

Figure 7:
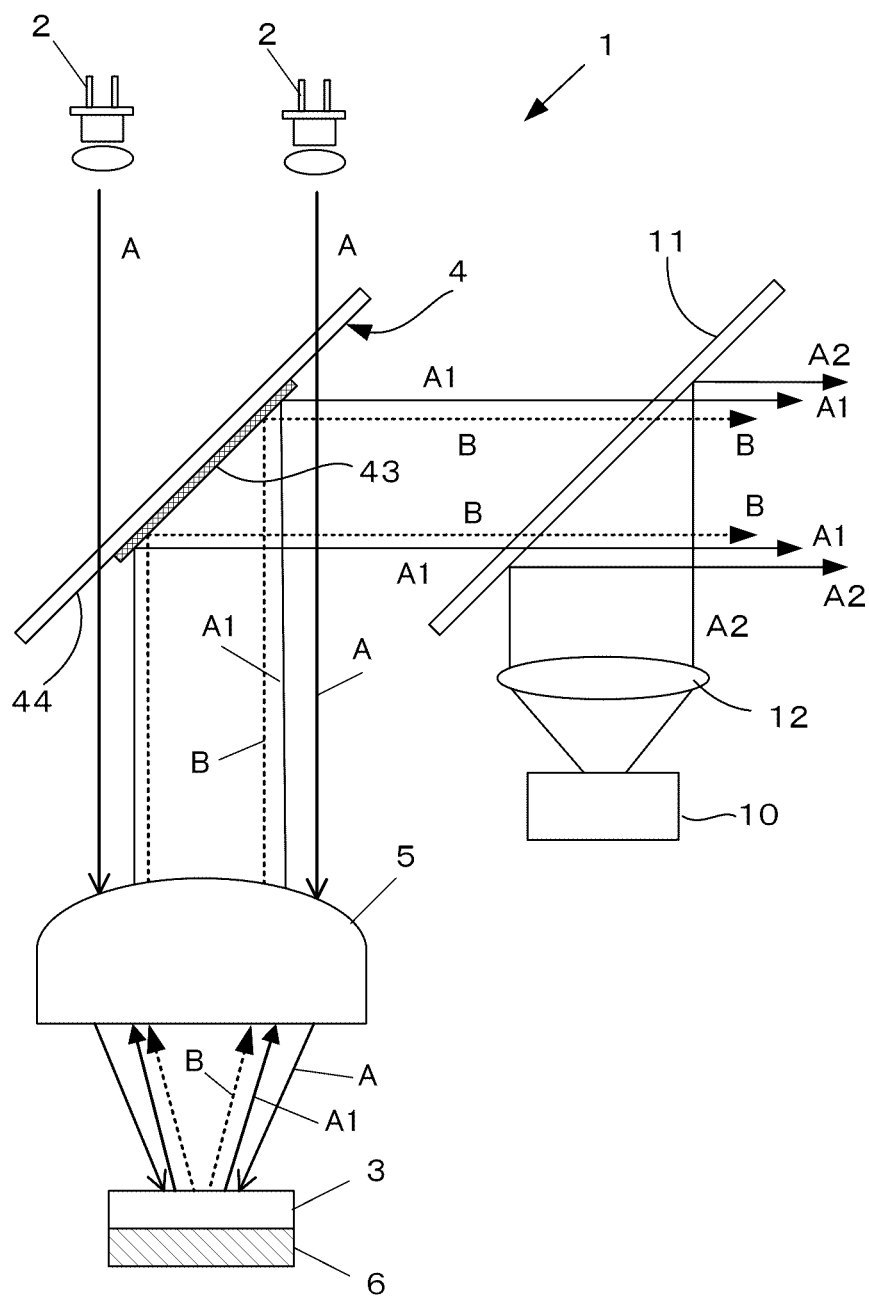
FIG. 7 is a schematic diagram of a seventh embodiment.

FIG. 7 illustrates a seventh embodiment. In this embodiment, radiation light A2 from the auxiliary light source 10 is added after the fluorescence B and partial excitation light A1 have been reflected by the first dichroic mirror 4.

In the figure, a second dichroic mirror 11 is disposed in an optical path of the fluorescence B and partial excitation light A1 from the wavelength conversion device 3 that have been reflected by the first dichroic mirror 4 to be emitted to the outside. The auxiliary light source 10 is disposed opposite this second dichroic mirror 11.

This second dichroic mirror 11 is wavelength-selective as with the second dichroic mirror in FIG. 1. When, for example, the blue excitation light A from the light-emitting devices 2 has a center wavelength of 455 nm and the blue radiation light A2 from the auxiliary light source 10 has a center wavelength of 430 nm, the second dichroic mirror 11 has a cut-off wavelength of around 440 nm so that the partial excitation light A1 (455 nm) is transmitted while the radiation light A2 (430 nm) is reflected.

Thus the blue radiation light A2 from the auxiliary light source 10 is added to the white light reflected by the first dichroic mirror 4 and emitted to the outside.

Figure 8:
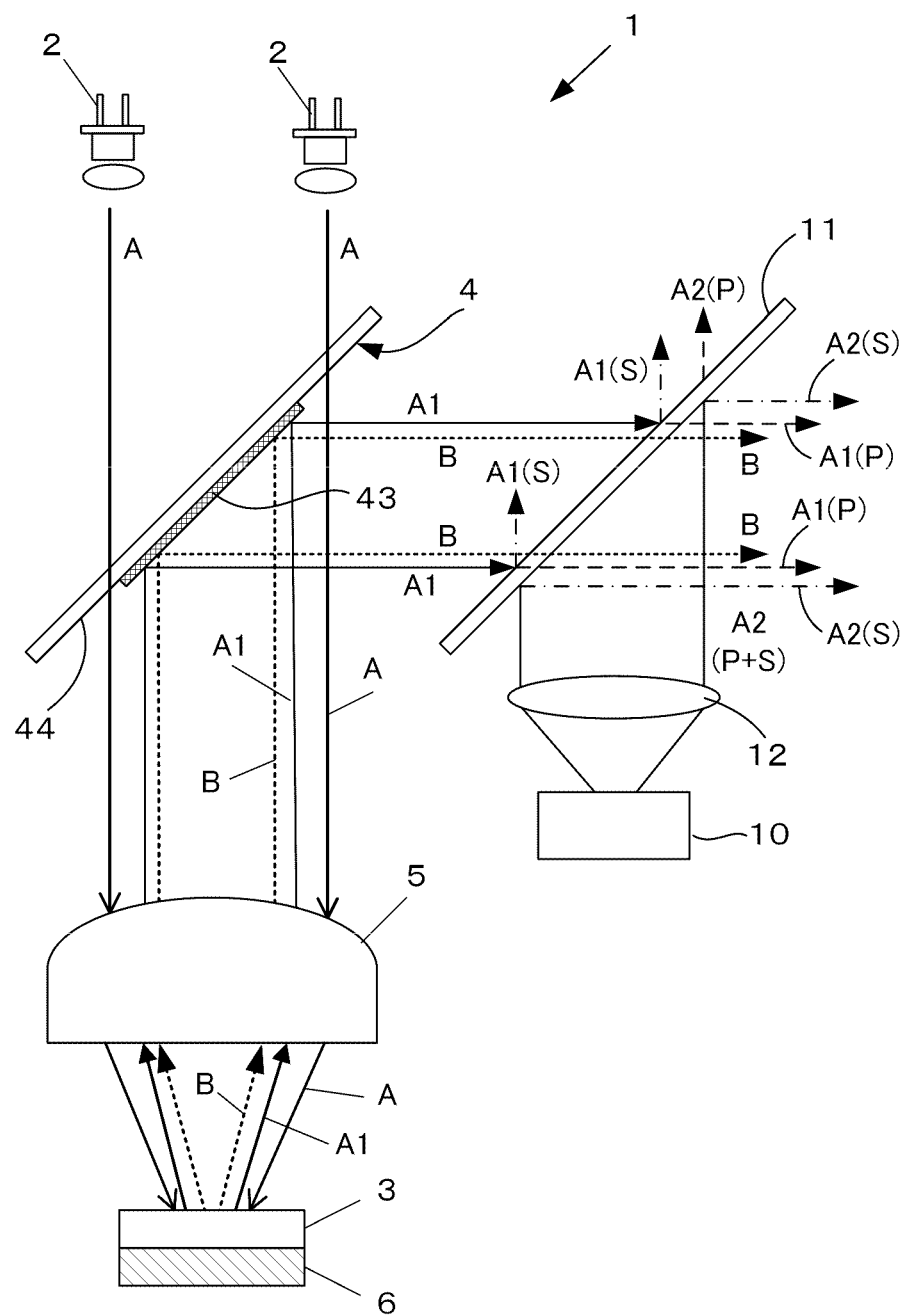
FIG. 8 is a schematic diagram of an eighth embodiment.

The eighth embodiment illustrated in FIG. 8 corresponds to the embodiments of FIG. 3 to FIG. 5, wherein the second dichroic mirror 11 is polarization-selective.

Namely, this second dichroic mirror 11 reflects and transmits the S-polarized component and P-polarized component, respectively, of the partial excitation light A1 from the first dichroic mirror 4, and transmits and reflects the P-polarized component and S-polarized component, respectively, of the radiation light A2 from the auxiliary light source 10. Thus the S-polarized component of the radiation light A2 from the auxiliary light source 10 is added to the fluorescence B and the P-polarized component of the partial excitation light A1 from the wavelength conversion device 3.

Figure 9:
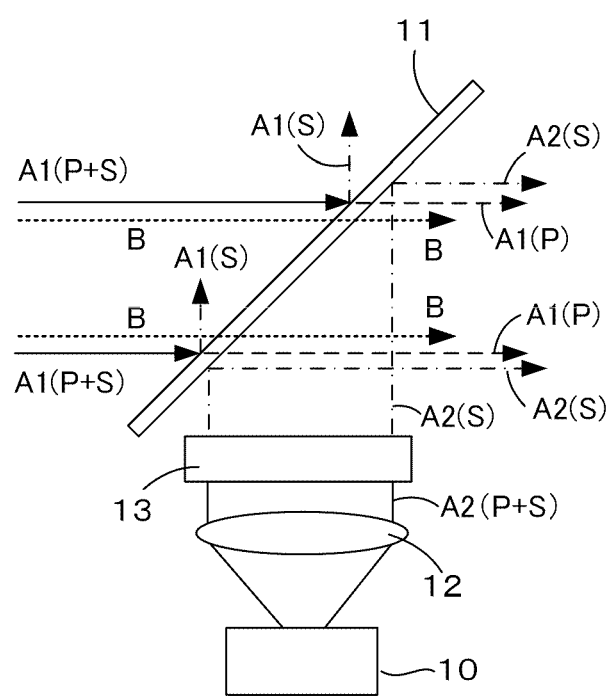
FIG. 9 is a schematic diagram of a ninth embodiment.
Figure 10:
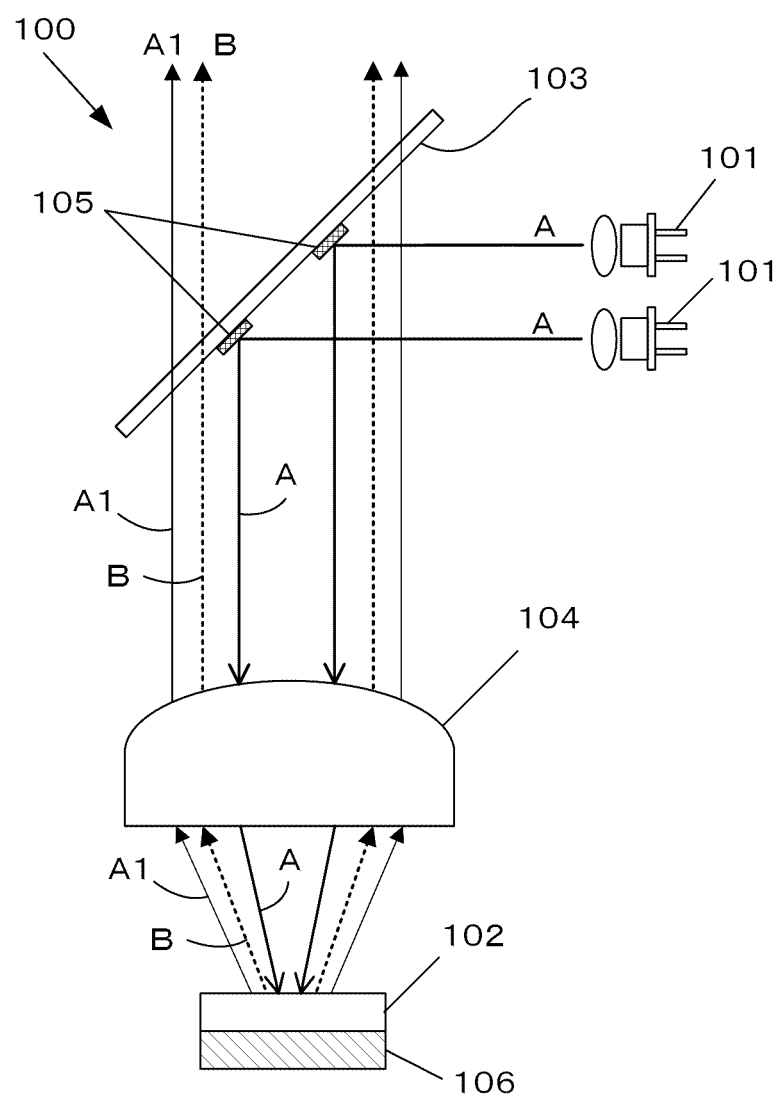
FIG. 10 is a schematic diagram of an existing technique.

A ninth embodiment illustrated in FIG. 9 is similar to the fifth embodiment of FIG. 5.

A polarization conversion device 13 is disposed between the auxiliary light source 10 and the second dichroic mirror 11. This polarization conversion device 13 changes the P-polarized component of the radiation light A2 from the auxiliary light source 10 into the S-polarized component, so that the radiation light A2 from the auxiliary light source 10 is entirely the S-polarized component, which is all reflected by the second dichroic mirror 11 and mixed with the white light. Therefore, all the radiation light A2 from the auxiliary light source 10 can be efficiently utilized.

The phrase " . . . reflects or transmits the excitation light and . . . transmits or reflects the fluorescence and partial excitation light" used herein means that two configurations are complementary with each other so that when one reflects light, the other transmits that light.

As described above, the fluorescent light source device of the present invention includes: a light-emitting device emitting blue excitation light; a wavelength conversion device excited by the excitation light and producing yellow fluorescence; a focusing optical system focusing the excitation light onto the wavelength conversion device; and a dichroic mirror that reflects or transmits the excitation light and transmits or reflects the fluorescence, the fluorescent light source device mixing the fluorescence from the wavelength conversion device and partial excitation light that was not converted by the wavelength conversion device together and emitting white light. The device provides the effect of maintaining a constant color temperature of the emitted white light, when the color temperature of the white light from the fluorescent light source device undergoes a change because of a change in the fluorescence conversion efficiency of the wavelength conversion device as a result of fluctuations in the intensity of excitation light from the light-emitting device incident to the wavelength conversion device, by mixing the same blue radiation light from an auxiliary light source to compensate for the relatively diminished excitation light.

DESCRIPTION OF REFERENCE SIGNS

1 Fluorescent light source device
2 Light-emitting device
3 Wavelength conversion device
4 First dichroic mirror
41 Excitation light reflecting part
42 Fluorescence/excitation light transmitting part
43 Fluorescence/excitation light reflecting part
44 Excitation light transmitting part
5 Focusing optical system
6 Reflection layer
10 Auxiliary light source
11 Second dichroic mirror
12 Collimation lens
13 Polarization conversion device
A Excitation light
A1 Partial excitation light
A2 Radiation light (from auxiliary light source)
B Fluorescence

The invention claimed is:
1. A fluorescent light source device comprising:
a light-emitting device emitting blue excitation light;
a wavelength conversion device excited by the excitation light and producing yellow fluorescence;

a focusing optical system focusing the excitation light onto the wavelength conversion device; and a first dichroic mirror including a region that reflects or transmits the excitation light and a region that transmits or reflects the fluorescence and partial excitation light that was not converted by the wavelength conversion device, the fluorescent light source device mixing fluorescence and partial excitation light from the wavelength conversion device together and emitting white light, and further comprising an auxiliary light source emitting light in a blue region identical to that of the excitation light, wherein radiation light from the auxiliary light source is mixed with white light that is a mixture of the fluorescence and the partial excitation light from the first dichroic mirror, wherein the first dichroic mirror reflects the excitation light and transmits the fluorescence and partial excitation light that was not converted by the wavelength conversion device, the auxiliary light source emits light in a blue region identical to that of the excitation light from the light-emitting device and of a different wavelength, and the fluorescent light source device further comprises a second dichroic mirror that is wavelength-selective and transmits fluorescence and partial excitation light that have been transmitted through the first dichroic mirror while reflecting radiation light from the auxiliary light source, disposed between the auxiliary light source and the first dichroic mirror.

2. The fluorescent light source device according to claim 1, wherein the first dichroic mirror is provided, on a surface thereof from which the fluorescence and the partial excitation light exit, with a function of transmitting the fluorescence and the partial excitation light and of reflecting radiation light from the auxiliary light source, to serve as both the first dichroic mirror and the second dichroic mirror.

3. A fluorescent light source device comprising:
a light-emitting device emitting blue excitation light;
a wavelength conversion device excited by the excitation light and producing yellow fluorescence;
a focusing optical system focusing the excitation light onto the wavelength conversion device; and
a first dichroic mirror including a region that reflects or transmits the excitation light and a region that transmits or reflects the fluorescence and partial excitation light that was not converted by the wavelength conversion device,
the fluorescent light source device mixing fluorescence and partial excitation light from the wavelength conversion device together and emitting white light,
and further comprising an auxiliary light source emitting light in a blue region identical to that of the excitation light, wherein
radiation light from the auxiliary light source is mixed with white light that is a mixture of the fluorescence and the partial excitation light from the first dichroic mirror, wherein
the first dichroic mirror reflects the excitation light and transmits the fluorescence and partial excitation light that was not converted by the wavelength conversion device,
the auxiliary light source emits light of a wavelength identical to that of the excitation light from the light-emitting device, and the fluorescent light source device further comprises a second dichroic mirror that is polarization-selective and transmits the fluorescence that has been transmitted through the first dichroic mirror, and transmits and reflects a P-polarized component and an S-polarized component, respectively, of the partial excitation light and radiation light from the auxiliary light source, disposed between the auxiliary light source and the first dichroic mirror.

4. The fluorescent light source device according to claim 3, wherein the first dichroic mirror is provided, on a surface thereof from which the fluorescence and the partial excitation light exit, with a function of transmitting the fluorescence, and of transmitting and reflecting a P-polarized component and an S-polarized component, respectively, of the partial excitation light and radiation light from the auxiliary light source, to serve as both the first dichroic mirror and the second dichroic mirror.

5. The fluorescent light source device according to claim 3, further comprising a polarization conversion device that converts a P-polarized component of radiation light from the auxiliary light source into an S-polarized component, disposed between the auxiliary light source and the second dichroic mirror.

6. The fluorescent light source device according to claim 4, further comprising a polarization conversion device that converts a P-polarized component of radiation light from the auxiliary light source into an S-polarized component, disposed between the auxiliary light source and the second dichroic mirror.

7. A fluorescent light source device comprising:
a light-emitting device emitting blue excitation light;
a wavelength conversion device excited by the excitation light and producing yellow fluorescence;
a focusing optical system focusing the excitation light onto the wavelength conversion device; and
a first dichroic mirror including a region that reflects or transmits the excitation light and a region that transmits or reflects the fluorescence and partial excitation light that was not converted by the wavelength conversion device,
the fluorescent light source device mixing fluorescence and partial excitation light from the wavelength conversion device together and emitting white light,
and further comprising an auxiliary light source emitting light in a blue region identical to that of the excitation light, wherein
radiation light from the auxiliary light source is mixed with white light that is a mixture of the fluorescence and the partial excitation light from the first dichroic mirror, wherein
the first dichroic mirror transmits the excitation light and reflects the fluorescence and partial excitation light that was not converted by the wavelength conversion device,
the auxiliary light source emits light in a blue region identical to that of the excitation light from the light-emitting device and of a different wavelength, and
the fluorescent light source device further comprises a second dichroic mirror that is wavelength-selective and transmits fluorescence and partial excitation light reflected by the first dichroic mirror while reflecting radiation light from the auxiliary light source, in an optical path of the fluorescence and the partial excitation light reflected by the first dichroic mirror.

* * * * *